（12） United States Patent
Yuan et al.

(10) Patent No.: US 10,777,134 B2
(45) Date of Patent: Sep. 15, 2020

(54) DETECTION METHOD OF PIXEL CIRCUIT COMPRISING VERIFYING PHASE, DRIVING METHOD OF DISPLAY PANEL, DISPLAY DEVICE AND PIXEL CIRCUIT

(71) Applicants: BOE Technology Group Co., Ltd., Beijing (CN); Hefei Xinsheng Optoelectronics Technology Co., Ltd., Hefei (CN)

(72) Inventors: Can Yuan, Beijing (CN); Yongqian Li, Beijing (CN); Zhenfei Cai, Beijing (CN); Zhidong Yuan, Beijing (CN); Dongxu Han, Beijing (CN)

(73) Assignees: BOE Technology Group Co., Ltd., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 130 days.

(21) Appl. No.: 16/035,891

(22) Filed: Jul. 16, 2018

(65) Prior Publication Data
US 2019/0147797 A1 May 16, 2019

(30) Foreign Application Priority Data
Nov. 15, 2017 (CN) .......................... 2017 1 1131661

(51) Int. Cl.
*G09G 3/3233* (2016.01)
*H01L 51/52* (2006.01)
(Continued)

(52) U.S. Cl.
CPC ............. *G09G 3/3233* (2013.01); *G09G 3/20* (2013.01); *G09G 3/3258* (2013.01);
(Continued)

(58) Field of Classification Search
CPC .. G09G 3/20; G09G 3/30; G09G 3/32; G09G 3/3208; G09G 3/3225; G09G 3/3233;
(Continued)

(56) References Cited

U.S. PATENT DOCUMENTS

2009/0128534 A1  5/2009  Fish et al.
2011/0164021 A1  7/2011  Seto
(Continued)

FOREIGN PATENT DOCUMENTS

CN    101048809 A    10/2007
CN    102192789 A    9/2011
(Continued)

OTHER PUBLICATIONS

Mar. 11, 2019—(CN) First Office Action Appn 201711131661.8 with English Translation.

*Primary Examiner* — Keith L Crawley
(74) *Attorney, Agent, or Firm* — Banner & Witcoff, Ltd.

(57) ABSTRACT

A detection method of a pixel circuit, a driving method of a display panel, a display device and a pixel circuit are provided. The pixel circuit includes a driving transistor, and the detection method includes a writing phase and a reading phase. The writing phase includes: writing a reference data voltage to a gate electrode of the driving transistor, and writing a first detection writing voltage to a first electrode of the driving transistor to turn on the driving transistor; and the reading phase includes: upon the driving transistor being turned off after a first predetermined time after writing the first detection writing voltage, reading a voltage of the first electrode of the driving transistor to obtain a first detection reading voltage for obtaining a threshold voltage of the driving transistor.

17 Claims, 5 Drawing Sheets

(51) Int. Cl.
  *H01L 27/32* (2006.01)
  *G09G 3/20* (2006.01)
  *G09G 3/3258* (2016.01)

(52) U.S. Cl.
  CPC ...... *H01L 27/3248* (2013.01); *H01L 51/5203* (2013.01); *G09G 2310/0264* (2013.01); *G09G 2310/08* (2013.01); *G09G 2320/0295* (2013.01); *G09G 2320/045* (2013.01)

(58) Field of Classification Search
  CPC .............. G09G 3/3258; G09G 3/3291; G09G 2300/0819; G09G 2310/0264; G09G 2310/08; G09G 2320/0233; G09G 2320/0295; G09G 2320/043; G09G 2320/045; H01L 27/3244; H01L 27/3248; H01L 51/5203
  See application file for complete search history.

(56) References Cited

U.S. PATENT DOCUMENTS

| | | | |
|---|---|---|---|
| 2011/0182323 A1 | 7/2011 | Horiuchi | |
| 2015/0294626 A1* | 10/2015 | Bi | G09G 3/3233 |
| | | | 345/211 |
| 2016/0189623 A1* | 6/2016 | Miwa | G09G 3/3258 |
| | | | 345/212 |
| 2016/0351096 A1* | 12/2016 | Tani | G09G 3/3233 |
| 2017/0061892 A1* | 3/2017 | Jung | G09G 3/3291 |
| 2017/0124947 A1* | 5/2017 | Kim | G09G 3/3233 |

FOREIGN PATENT DOCUMENTS

| | | |
|---|---|---|
| CN | 102227763 A | 10/2011 |
| CN | 106782326 A | 5/2017 |
| CN | 107301840 A | 10/2017 |

\* cited by examiner

DETECTION METHOD OF PIXEL CIRCUIT COMPRISING VERIFYING PHASE, DRIVING METHOD OF DISPLAY PANEL, DISPLAY DEVICE AND PIXEL CIRCUIT

CROSS REFERENCE

This application claims priority to and the benefit of Chinese Patent Application No. 201711131661.8 filed on Nov. 15, 2017, which application is incorporated herein in its entirety.

TECHNICAL FIELD

At least one embodiment of the present disclosure relates to a detection method of a pixel circuit, a driving method of a display panel, a display device and a pixel circuit.

BACKGROUND

Flat display panels have become the mainstream products in the current display panels because of the advantages such as lightness, portability, low power consumption and so on. The flat display panel is, for example, an organic light-emitting diode (OLED) display panel a liquid crystal display (LCD) panel or the like. For example, the OLED display panel is mostly an active matrix (AM) type display panel, which uses a thin film transistor (TFT) and a capacitor to drive the OLED to emit light. The thin film transistor connected to the OLED and controlling a current flowing through the OLED is generally called a driving transistor, and the stability of the threshold voltage of the driving transistor has an important influence on the display quality of a display panel.

SUMMARY

An embodiment of the present disclosure provides a detection method of a pixel circuit, the pixel circuit comprises a driving transistor, the detection method comprises a writing phase and a reading phase, and the writing phase comprises: writing a reference data voltage to a gate electrode of the driving transistor, and writing a first detection writing voltage to a first electrode of the driving transistor to turn on the driving transistor, wherein the reference data voltage is less than or equal to the first detection writing voltage; and the reading phase comprises: upon the driving transistor being turned off after a first predetermined time after writing the first detection writing voltage, reading a voltage of the first electrode of the driving transistor to obtain a first detection reading voltage for obtaining a threshold voltage of the driving transistor.

An embodiment of the present disclosure provides a driving method of a display panel, the display panel comprises a pixel circuit, and the driving method comprises: performing the above detection method for the pixel circuit to obtain a threshold voltage of a driving transistor of the pixel circuit.

An embodiment of the present disclosure provides a display device, the display device comprises a pixel circuit and a control circuit, the pixel circuit comprises a driving transistor; the control circuit is configured to perform a detection method, and the detection method comprises a writing phase and a reading phase, the writing phase comprises: writing a reference data voltage to a gate electrode of the driving transistor, and writing a first detection writing voltage to a first electrode of the driving transistor to turn on the driving transistor, and the reference data voltage is less than or equal to the first detection writing voltage; and the reading phase comprises: upon the driving transistor being turned off after a first predetermined time after writing the first detection writing voltage, reading a voltage of the first electrode of the driving transistor to obtain a first detection reading voltage for obtaining a threshold voltage of the driving transistor.

An embodiment of the present disclosure provides a pixel circuit, comprising a plurality of sub-pixel units disposed in an array, a plurality of detection lines, and a plurality of detection control lines, each of the sub-pixel units comprises a driving transistor and a detection switching circuit, the detection switching circuit comprises a first terminal, a second terminal and a control terminal; the first terminal of the detection switching circuit is connected to the driving transistor, the second terminals of the detection switching circuits of at least two sub-pixel units disposed in a same row are connected to a same detection line and the control terminals of the detection switching circuits of the at least two sub-pixel units are connected to different detection control lines.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
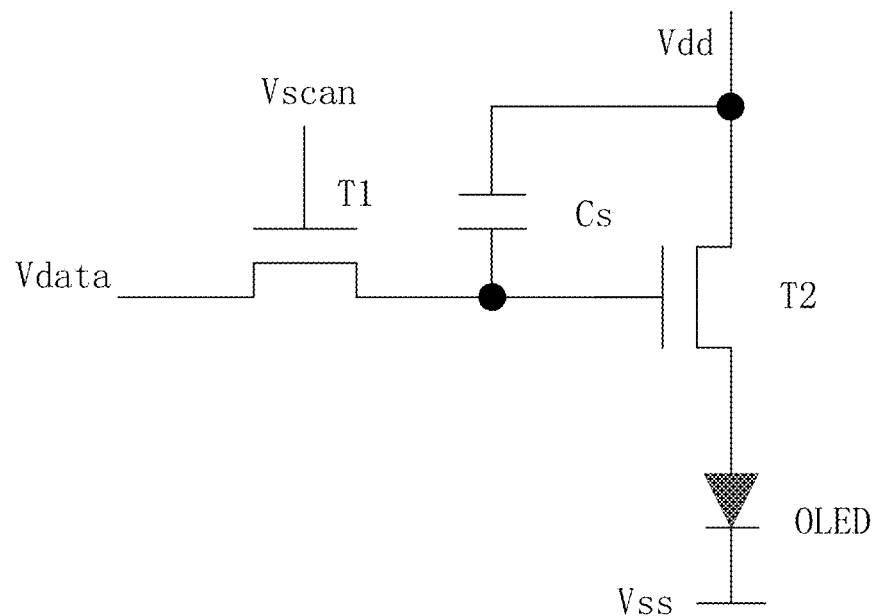
FIGS. 1A-1B are schematic diagrams of two kinds of 2T1C pixel circuits.

The technical solutions in the embodiments of the present disclosure will be described clearly and completely with reference to the accompanying drawings. Embodiments and their various features and advantageous details are illustrated completely in the following non-limiting exemplary embodiments and the accompanying drawings. It should be noted that the features shown in the figures are not necessarily drawn according to a scale. The present disclosure omits descriptions of known materials, components, and process techniques so as not to obscure the exemplary embodiments of the present disclosure. The embodiments are given only to facilitate an understanding of the implementation of the exemplary embodiments of the present disclosure, and to enable those skilled in the art to practice the exemplary embodiments. Therefore, the embodiments are not to be construed as limiting the scope of the embodiments of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. In addition, in the various embodiments of the present disclosure, the same or similar reference numerals represent the same or similar components.

Figure 1B:
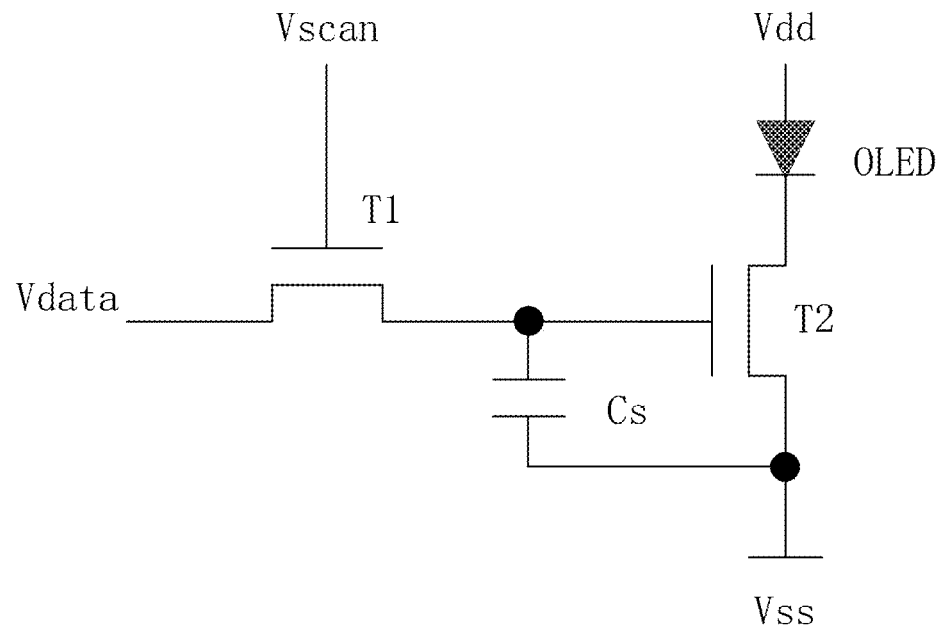

The pixel circuit of an OLED display device generally comprises a plurality of sub-pixel units disposed in an array, each of the sub-pixel units comprises an organic light emitting component, that is, an OLED device and a driving transistor, and the pixel circuit is configured to drive the OLED to emit light of a predetermined intensity based on a data signal. The pixel circuit generally comprises a 2T1C pixel circuit, which uses two TFTs and a storage capacitor Cs to realize the basic function of driving the OLED to emit light; one TFT is a switching transistor, which mainly functions as a switch to control the transmission of data signals; the other TFT is a driving transistor, which mainly functions as a driver to provide a driving current to a pixel electrode used as a cathode or an anode of the OLED device. FIGS. 1A and 1B illustrates schematic diagrams of two 2T1C pixel circuits, respectively.

As illustrated in FIG. 1A, a 2T1C pixel circuit comprises a switching transistor T1, a driving transistor T2 and a storage capacitor Cs. For example, the switching transistor T1 and the driving transistor T2 are both N-type TFTs. A gate electrode of the switching transistor T1 is connected to a gate line (scan line) to receive a scan signal (Vscan), a first electrode of the switching transistor T1 is connected to a gate electrode of the driving transistor T2, and a second electrode of the switching transistor T1 is connected to a data line to receive a data signal (Vdata). A first electrode of the driving transistor T2 is connected to a positive terminal of an OLED, and a second electrode of the driving transistor T2 is connected to a first power terminal (Vdd, a high voltage terminal). One terminal of the storage capacitor Cs is connected to the first electrode of the switching transistor T1 and the gate electrode of the driving transistor T2, and the other terminal of the storage capacitor Cs is connected to the second electrode of the driving transistor T2 and the first power terminal. A cathode of the OLED is connected to a second power terminal (Vss, a low voltage terminal), for example, to ground. A driving method of the 2T1C pixel circuit is controlling a brightness and darkness (grayscale) of a pixel via the two TFTs and the storage capacitor Cs. Where the scan signal Vscan is applied through the gate line to turn on the switching transistor T1, the data voltage (Vdata) transmitted through the data line from the data driving circuit charges the storage capacitor Cs via the switching transistor T1, thereby storing the data voltage in the storage capacitor Cs. The stored data voltage controls a conduction degree of the driving transistor T1, thereby controlling a magnitude of the current flowing through the driving transistor to drive the OLED to emit light, that is, the current determines the grayscale of the pixel illumination.

As illustrated in FIG. 1B, another 2T1C pixel circuit comprises a switching transistor T1, a driving transistor T2 and a storage capacitor Cs, but the connection manner thereof is slightly changed. More specifically, the modification of the pixel circuit of FIG. 1B with respect to that of FIG. 1A lies in that the positive terminal of the OLED is connected to the first power terminal (Vdd, a high voltage terminal) and the negative terminal is connected to the second electrode of the driving transistor T2, and the first electrode of the driving transistor T2 is connected to the second power terminal (Vss, a low voltage terminal), for example, to ground. One terminal of the storage capacitor Cs is connected to the first electrode of the switching transistor T1 and the gate electrode of the driving transistor T2, and the other terminal of the storage capacitor Cs is connected to the first electrode of the driving transistor T2 and the second power terminal. An operation method of the 2T1C pixel circuit is basically the same as that of the pixel circuit illustrated in FIG. 1A, and details are not described again.

In an active matrix display panel, for example, in an OLED display panel, a threshold voltage of a driving transistor in each of the pixel units may be different because of a manufacture process and because of, for example, the influence of a change in deposition or annealing temperature, the threshold voltage of the driving transistor may generate a phenomenon of a drift, such as a negative drift or a positive drift, and drift degrees of the threshold voltages of the driving transistors in pixel units at different positions of the display panel may be different. The difference in threshold voltage of each of the driving transistors may cause the display panel not to display uniformly.

For example, for a display panel using an N-type TFT as a driving transistor, where the threshold voltage of the N-type TFT generates a negative drift, the N-type TFT cannot be completely turned off by an OFF signal, and therefore the driving current still flows through the driving transistor to the OLED, which causes the OLED to emit light slightly, and further causes the screen to shine under the dark state, affecting the contrast of the display panel.

In order to improve the display uniformity of the entire panel, it is necessary to compensate for the threshold voltage drift of the driving transistor in the pixel unit. The compensation function can be realized by voltage compensation, current compensation or hybrid compensation; alternatively, for the pixel circuit, the compensation function can be realized by internal compensation, external compensation, or the like. The internal compensation comprises that the pixel circuit is designed to enable the pixel circuit itself to implement the compensation function itself; and the external compensation comprises adding an external detection circuit to the pixel circuit, detecting the drift degree of the threshold voltage of the driving transistor, and then modifying the data voltage applied in the display process according to the detected threshold voltage drift, and therefore eliminating the effect of the threshold voltage of the drive transistor on the driving current, and enabling the display panel to achieve better brightness uniformity. However, the current detection circuit is designed to mainly detect the positive drift of the threshold voltage.

For example, on the basis of the above 2T1C, in order to compensate for, for example, the threshold voltage drift of the driving transistor, the voltage drop caused by the resistance of a power line, etc., the pixel circuit can further comprise a compensation circuit, the compensation circuit comprises an internal compensation circuit or an external compensation circuit, and the compensation circuit can comprise a transistor, a capacitor and so on. According to requirements, the pixel circuit can further comprise a reset circuit and so on.

Figure 2:
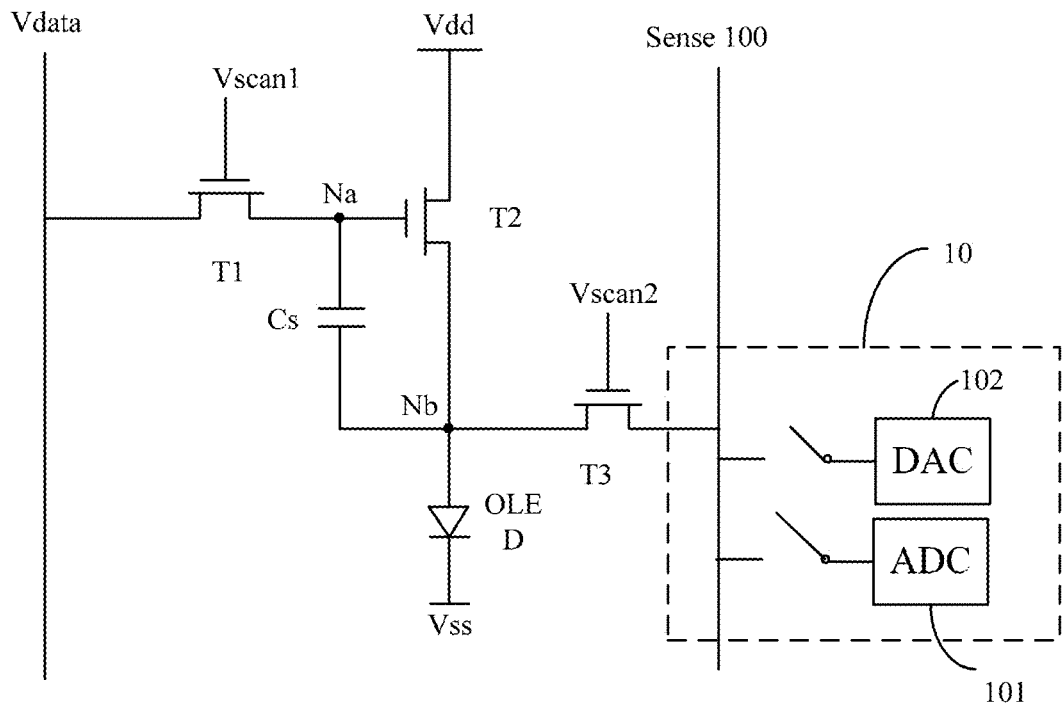
FIG. 2 is a schematic diagram of a 3T1C pixel circuit.

For example, FIG. 2 illustrates a 3T1C pixel circuit of a display panel, the display panel further comprises a detection circuit 10 used for the pixel circuit. The pixel circuit differs from the 2T1C pixel circuit illustrated in FIG. 1A in that the pixel circuit further comprises a detection switching circuit. In an example of the embodiment, the detection switching circuit comprises a detection switching transistor T3. The detection circuit 10 and the pixel circuit 11 are electrically connected through the detection switching circuit. In the specific example illustrated in FIG. 2, a storage capacitor Cs is connected between a gate electrode of a driving transistor T2 and a positive terminal of an OLED. A gate electrode of the detection switching transistor T3 is connected to a second scan signal Vscan2 (a gate electrode of a switching transistor T1 is connected to a first scan signal Vscan1), a first electrode of the detection switching transistor T3 is connected to a positive terminal of the OLED, and a second electrode of the detection switching transistor T3 is connected to the detection circuit 10. The detection circuit 10 comprises a detection line 100, and the detection line 100 is electrically connected to the second electrode of the detection switching transistor T3. Here, the gate electrode of the driving transistor T2 is defined as a first node Na, and the positive terminal of the OLED is defined as a second node Nb.

Embodiments of the present disclosure provide a detection method for a pixel circuit, a driving method of a display panel and a display device, which are capable of detecting a threshold voltage drift of a driving transistor in a pixel circuit, particularly a negative drift and so on, and therefore effectively compensating and alleviating the threshold voltage drift. The negative drift of the threshold voltage comprises a situation where the threshold voltage is negatively biased to less than zero.

It should be noted that the transistors used in the embodiments of the present disclosure can be thin film transistors, field effect transistors or other switching devices having the same characteristics. For example, the thin film transistors can be in various types, such as a top gate type or a bottom gate type. Further, an active layer of the thin film transistor can be made of various materials, such as amorphous silicon, polycrystalline silicon, a metal oxide semiconductor (for example, IGZO), or the like. For example, the N-type thin film transistor can be realized by adopting hydrogenating amorphous silicon, low temperature polycrystalline silicon, an oxide semiconductor, or the like. The first electrode and the second electrode of the transistor described herein may be a source electrode or a drain electrode, respectively, and may be symmetrical and indistinguishable in structure, so that the first electrode and the second electrode are interchangeable as needed. In addition, transistors can be divided into N-type transistors and P-type transistors according to the characteristics of the transistors. Embodiments of the present disclosure are described by taking the N-type transistor as an example. Based on the descriptions and teachings of the present disclosure, those skilled in the art can easily think of the implementations that the pixel circuits of the embodiments of the present disclosure can adopt the N-type transistor, the P-type transistor, or a combination of N-type and P-type transistors without creative efforts; therefore, these implementations are also within the scope of the present disclosure.

Whether the transistor is turned on or turned off is determined by a gate-source voltage (Vgs) and a threshold voltage (Vth). For the N-type transistor, the threshold voltage Vth is usually a positive value. Where Vgs<Vth, the N-type transistor is in a turn-off region, that is, the transistor is turned off; conversely, where Vgs≥Vth, the N-type transistor is in an on region, particularly, in the situation where a drain-source voltage Vds>Vgs−Vth, the N-type transistor is in a saturation region, and it can be considered that a drain-source current (Ids) is independent from the drain-source voltage Vds but related to a gate voltage Vgs. Similarly, for the P-type transistor, the threshold voltage Vth is generally a negative value, and where |Vgs|<|Vth|, the P-type transistor is in a turn-off region; conversely, where |Vgs|≥|Vth|, the P-type transistor is in an turn-on region, particularly, where |Vds|>|Vgs|−|Vth|, the P-type transistor is in a saturation region. For the driving transistor in the pixel circuit, the driving transistor is required to be in a saturation state where the driving transistor is in operation, so that the magnitude of the current flowing through the OLED can be controlled by controlling the gate-source voltage Vgs.

In actual industrial production, because of limitations of processes and materials, the threshold voltages of the above two type transistors usually drift, and the above rules are also applied. For example, the threshold voltage of the N-type transistor is negatively drifted to a negative value, in this situation, where the gate-source voltage Vgs of the N-type transistor is at a very small positive value or 0, the N-type transistor is turned on.

For example, a display device can comprise a data driver and a scan driver, a data signal (Vdata) is provided by the data driver, and a scan signal (Vscan1, Vscan2) is provided by the scan driver.

For example, the first power terminal (Vdd) is a high voltage terminal; and the second power terminal (Vss) is a low voltage terminal, such as ground.

Figure 3:
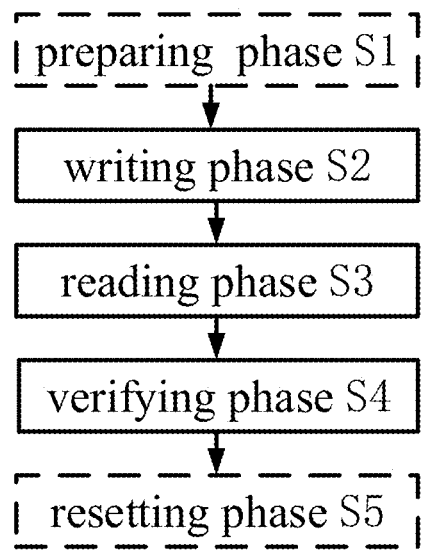
FIG. 3 is a flow diagram of a detection method of a pixel circuit provided by an embodiment of the present disclosure.
Figure 4:
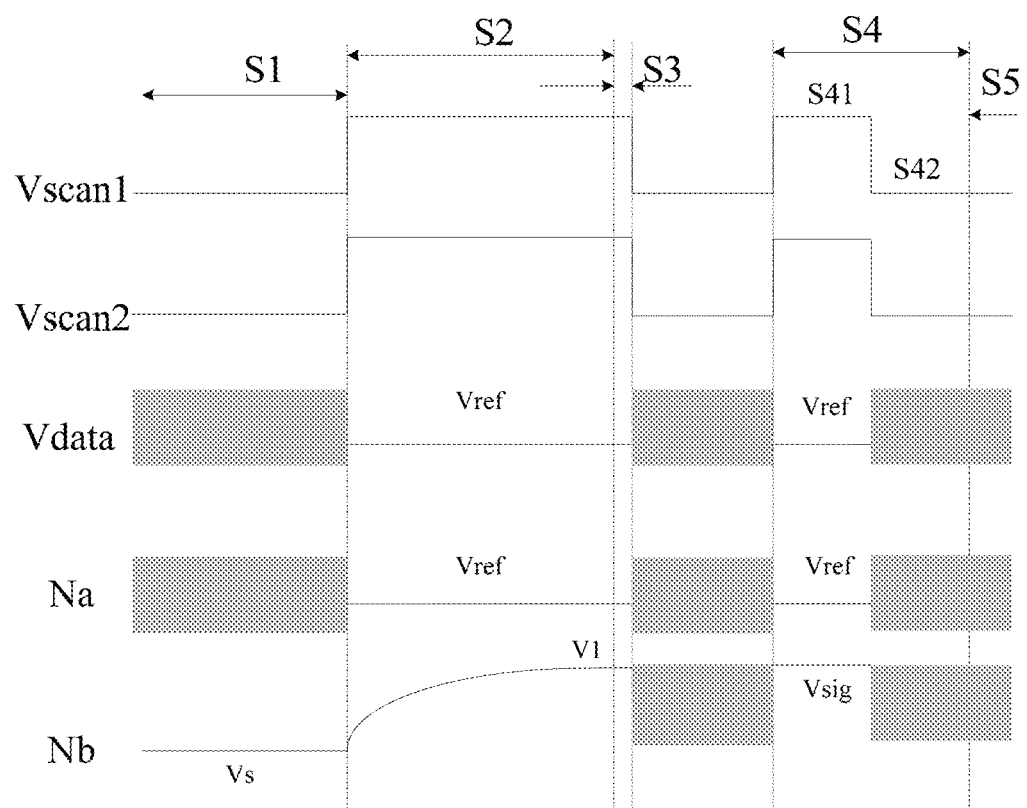
FIG. 4 is a signal timing diagram in a detection method of a pixel circuit provided by an embodiment of the present disclosure.

FIG. 3 is a flow diagram of a detection method for a pixel circuit provided by an embodiment of the present disclosure. The detection method is used for detecting a threshold voltage Vth of a driving transistor T2 in a pixel circuit, and the driving transistor T2 being an N-type transistor (such as an N-type thin film transistor) is taken as an example to illustrate. The detection method comprises a writing phase and a reading phase. FIG. 4 is a signal timing diagram in the detection method of a pixel circuit provided by an embodiment of the present disclosure. The detection method of a pixel circuit provided by the embodiment of the present disclosure can be applied, for example, in the pixel circuit illustrated in FIG. 2, and the threshold voltage of the driving transistor in the pixel circuit can be detected by the detecting circuit 10, but the method provided by the embodiment of the present disclosure is not limited to being applied in the 3T1C pixel circuit illustrated in FIG. 2, but can also be applied in other pixel circuits which can detect the threshold voltage of the driving transistor by, for example, reading the voltage information of the electrode of the driving transistor which is connected to the OLED.

The detection method of the embodiment of the present disclosure will be specifically described below with reference to FIGS. 2 to 4. The detection method of the embodiment can comprise a preparing phase S1, a writing phase S2, a reading phase S3, a first verifying phase S4, and a resetting phase S5. The detection method can be performed, for example, at a power-on period of a display device or during an interval period of a display operation.

In the preparing phase S1, the first scan signal Vscan1 and the second scan signal Vscan2 are both OFF signals (low voltage signals). In this situation, the switching transistor T1 and the detection switching transistor T3 are turned off, and the driving transistor T2 is in an initialized off state. The preparing phase S1 can be selected whether or not to be performed according to requirements.

In the writing phase S2, the first scan signal Vscan1 and the second scan signal Vscan2 are both ON signals (high voltage signals), and the data signal Vdata applied on the data line is a reference data voltage Vref. In this situation, both the switching transistor T1 and the detection switching transistor T3 are turned on. The reference data voltage Vref is transmitted to the first node Na via the switching transistor T1, that is, the reference data voltage Vref is written to the gate electrode of the driving transistor T2, and the reference data voltage Vref can be stored and maintained by the storage capacitor Cs. A first detection writing voltage V1 is written by the detection circuit 10 via the detection switching transistor T3 to the first electrode (source electrode) of the driving transistor T2, that is, the second node Nb. In this situation, where a gate voltage of the driving transistor T2 is Vref and a source voltage is V1, the gate-source voltage Vgs=Vref−V1. Therefore, the driving transistor T2 can be turned on by setting a magnitude relationship between the reference data voltage Vref and the first detection writing voltage V1, so as to allow the detection circuit 10 to be electrically connected to the first power voltage Vdd, and the storage capacitor Cs to be charged or discharged. Here, a charging time is set to be a first predetermined time t1.

For example, the detection circuit 10 comprises an analog to digital converter (ADC) 101 that is electrically connected to the detection line 100, the detection switching transistor T3 is configured to receive the first detection writing voltage V1 from the analog to digital converter 101 and transmit the first detection writing voltage V1 to the first electrode of the driving transistor T2.

For example, the threshold voltage of the driving transistor T2 is negatively drifted because of aging or the like, for example, the threshold voltage becomes less than zero. Here, because a target detection object is the driving transistor of which threshold voltage is less than 0, the reference data voltage Vref and the first detection writing voltage V1 can be set, for example, as: the former is less than or equal to the latter, or Vref and V1 are close, for example, Vref=V1=0.2 V, or Vref=0 and V1=0.2 V, etc., but the embodiment is not limited thereto. Where the threshold voltage of the driving transistor T2 is less than 0, the driving transistor T2 is turned on. As the charging progresses, the voltage of the second node Nb gradually rises. After the first predetermined time t1, the difference between the voltages of the first node Na and the second node Nb, that is, the difference Vgs between the voltages of the gate electrode and the source electrode of the driving transistor T2, becomes equal to the threshold voltage of the driving transistor T2. In this situation, the driving transistor T2 is turned off, and the charging process ends.

In the reading phase S3, the detection circuit 10 reads the voltage of the first electrode of the driving transistor T2 to obtain a first detection reading voltage Vsig.

For example, the detection circuit 10 further comprises a digital to analog converter (DAC) 102 that is electrically connected to the detection line 100, and the detection switching transistor T3 is configured to transmit the first detection reading voltage Vsig to the digital to analog converter 102, that is, the digital to analog converter 102 reads the voltage of the first electrode of the driving transistor T2 in this situation via the detection switching transistor T3, and records the first detection reading voltage Vsig.

For example, the detected threshold voltage Vth of the driving transistor T2 is Vth=Vref−Vsig. However, considering that the measurement for Vsig may have a certain error for various reasons (for example, the charging time t1 is not long enough to cause insufficient charging), this relationship is not always true.

For example, in the writing phase, the driving transistor T2 is turned on, because Vgs>Vth, Vref−V1>Vth; in the reading phase, the driving transistor T2 is turned off, and because Vgs≤Vth, Vref−Vsig≤Vth, and therefore the detected threshold voltage Vth of the driving transistor T2 has a numerical range of [Vref−Vsig, Vref−V1].

For example, the detection method can further comprise a first verifying phase S4 to verify whether the obtained Vth (Vref−Vsig) is correct.

The first verifying phase S4 comprises writing the reference data voltage Vref to the gate electrode of the driving transistor T2 and applying the first detection reading voltage Vsig to the first electrode of the driving transistor T2 for verification.

For example, the first verifying phase S4 comprises a first sub-verifying phase S41 and a second sub-verifying phase S42. In the first sub-verifying phase S41, the first scan signal Vscan1 and the second scan signal Vscan2 are both ON signals (high voltage signals), and both the switching transistor T1 and the detection switching transistor T3 are turned on. The data signal Vdata, which is the reference data voltage Vref, is applied through the data line, and the reference data voltage Vref is transmitted to the first node Na via the switching transistor T1, that is, the reference data voltage Vref is written to the gate electrode of the driving transistor T2. The first detection reading voltage Vsig is written by the detection circuit 10 via the detection switching transistor T3 to the first electrode of the driving transistor T2, that is, the second node Nb.

In the second sub-verifying phase S42, the first scan signal Vscan1 and the second scan signal Vscan2 are both OFF signals (low voltage signals), and both the switching transistor T1 and the detection switching transistor T3 are turned off. In this situation, judge whether the OLED in the detected pixel circuit emits light (that is, whether the corresponding pixel unit in the display panel emits light). Where the OLED does not emit light, the detection process ends, and the threshold voltage of the driving transistor of the pixel circuit is obtained. However, where the OLED emits light, it is indicated that the value or the value range of the threshold voltage of the detected driving transistor T2 is too large and can be further adjusted.

For example, there are various ways to detect whether the corresponding OLED emits light, for example, by photographing by a camera in a dark environment (for example, a dark room), and then detecting the photographed image, or detecting together by a photometer or the like.

In order to obtain the correct threshold voltage of the driving transistor, a multiple approximation method can be used. For example, in an exemplary method, in a situation where a same reference data voltage Vref is written to the gate electrode of the driving transistor, a value larger than the first detection reading voltage Vsig can be directly selected as the second detection reading voltage Vsig2 to be written to the first electrode of the driving transistor T2 and observe whether the OLED emits light. Where the OLED does not emit light, the detection process ends; where the OLED still emits light, the second detection reading voltage Vsig2 is increased to repeat the above first verifying phase until the OLED does not emit light where a Nth detection reading voltage Vsign is written to the first electrode of the driving transistor T2, and the detection process ends. The detected threshold voltage Vth=Vref−Vsign.

For example, in another exemplary method, the above writing phase S2 and reading phase S3 can be repeated, and the first predetermined time t1 in the reading phase S3 is increased, and therefore a second detection reading voltage Vsig2 is obtained, and then a second verifying phase S40 is performed. In the second verifying phase S40, the second detection reading voltage Vsig2 is written to the first electrode of the driving transistor T2 to observe whether the OLED emits light. Where the OLED does not emit light, the detection process ends; where the OLED still emits light, the above writing phase S2 and reading phase S3 are continuously repeated, and the first predetermined time t1 in the reading phase S3 is continuously increased, and another second verifying phase S40 is performed until the Nth detection reading voltage Vsign is obtained, and the OLED does not emit light where the Nth detection reading voltage Vsign is written to the first electrode of the driving transistor T2, the detection process ends. The detected threshold voltage Vth=Vref−Vsign.

For example, the detection method can further comprise a resetting phase S5. In the resetting phase S5, the first scan signal Vscan1, the second scan signal Vscan2, and the data signal Vdata are all OFF signals (low voltage signals), the switching transistor T1 and the detection switching transistor T3 are both turned off, and the circuit gradually returns to the preparing state. Alternatively, the first scan signal Vscan1 is an OFF signal, and the second scan signal Vscan2 is an ON signal, so that the switching transistor T1 is turned off but the detection switching transistor T3 is turned on. In this situation, a low voltage (i. e., a reset voltage) is applied to the detection line, and therefore the second node Nb is reset.

In another embodiment of the present disclosure, the sub-pixel units in the display device are disposed in a plurality of rows and a plurality of columns, and the sub-pixel units in a same row are driven, for example, by a same gate line, and the sub-pixel units in a same column are driven, for example, by a same data line. For example, each detection circuit 10 can correspond to and be connected to a plurality of sub-pixel units disposed in a same row, and therefore the threshold voltages of the plurality of sub-pixel units disposed in the same row can be respectively detected in a time sharing manner via a same detection line by the detection circuit 10. For example, each of the sub-pixel units further comprises a detection switching circuit, the detection switching circuits of at least two sub-pixel units disposed in the same row connect the driving transistors to the same detection line, and the threshold voltages of the driving transistors of the at least two sub-pixel units disposed in the same row are detected by turning on the detection switching circuits of the at least two sub-pixel units in the time sharing manner. In the present disclosure, the row direction refers to a direction along which the gate line (scan line) extends.

Figure 5:
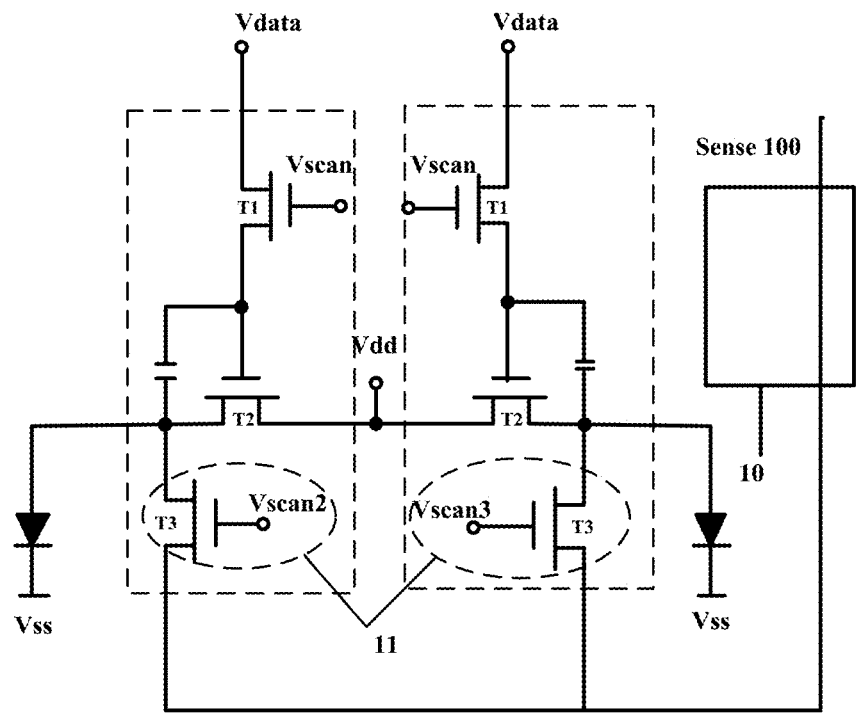
FIG. 5 is a schematic diagram of a pixel circuit provided by an embodiment of the present disclosure.

Correspondingly, an embodiment of the present disclosure further provides a pixel circuit, and the pixel circuit comprises a plurality of sub-pixel units disposed in an array, a plurality of detection lines, and a plurality of detection control lines. FIG. 5 is a schematic diagram of a pixel circuit provided by an embodiment of the present disclosure. As illustrated in FIG. 5, a same detection line 100 of a detection circuit 10 is connected to two sub-pixel units disposed in a same row (referring to two broken rectangular frames in the figure), and each of the sub-pixel units comprises a detection switching circuit 11 and is connected to the detection line 100 respectively through the corresponding detection switching circuit 11 (referring to the dashed oval frames in the figure). The detection switching circuit 11 comprises a first terminal, a second terminal and a control terminal. The first terminal is connected to the driving transistor T2, the second terminal is connected to the detection circuit 10 through the same detection line 100, and the control terminal is connected to different detection control lines. In an example of the embodiment, the detection switching circuit 11 comprises a detection switching transistor T3, and gate electrodes of the two detection switching transistors T3 are respectively connected to different detection control lines to receive two different scan signals, that is, a second scan signal Vscan2 and a third scan signal Vscan3. The detection switching transistors T3 are correspondingly controlled by the second scan signal Vscan2 and the third scan signal Vscan3, respectively, so that during each detection process, signals are transmitted between the detection circuit 10 and only one of the two sub-pixel units to perform the above detection process, which is not described again.

Figure 6:
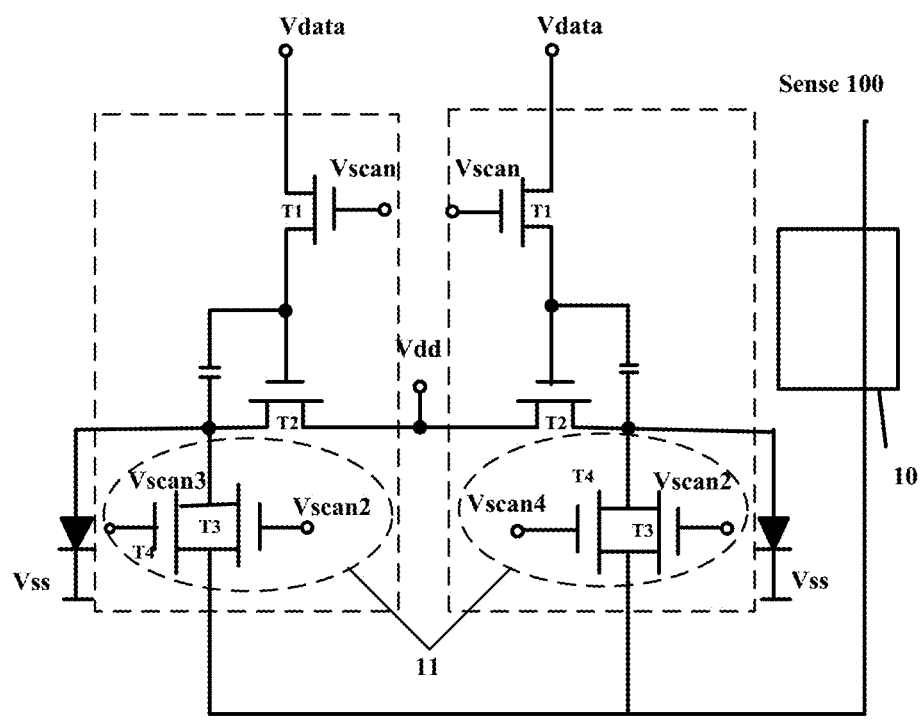
FIG. 6 is a schematic diagram of a pixel circuit provided by another embodiment of the present disclosure.

In another embodiment, referring to FIG. 6, each detection circuit 11 comprises a first detection switching transistor T3 and a second detection switching transistor T4 in parallel. The gate electrodes of the first detection switching transistors T3 of the two sub-pixel units disposed in the same row are connected to a same scan signal, that is, the second scan signal Vscan2; however, the gate electrodes of the second detection switching transistors T4 are respectively connected to different detection control lines, that is, a third scan signal Vscan3 and a fourth scan signal Vscan4. The detection circuits are correspondingly controlled by the second scan signal Vscan2, the third scan signal Vscan3, and the fourth scan signal Vscan4, respectively, so that during each detection process, signals are transmitted between the detection circuit 10 and only one of the two sub-pixel units to perform the above detection process, which is not described again.

The above pixel circuit and detection method can be applied to various OLED pixel structures, for example, a pixel structure in which a pixel unit comprises three sub-pixel units of R, G, and B, or a pixel structure in which a pixel unit comprises four sub-pixel units of R, G, B, and W.

For example, for the pixel structure in which a pixel unit comprises four sub-pixel units of R, G, B, and W, the pixel circuits of the R and G sub-pixel units can be detected by a same detection line in a time sharing manner, and the pixel circuits of the B and W sub-pixel units can be detected by a same detection line in a time sharing manner.

An embodiment of the present disclosure further provides a driving method of a display panel, and the driving method comprises the above detection method of a pixel circuit.

For example, the driving method further comprises establishing a compensation value of the pixel circuit of each sub-pixel unit according to the detected threshold voltage.

For example, in order to obtain the compensation value of each sub-pixel unit, a current-voltage characteristic curve of the driving transistor T2 is obtained through the detected threshold voltage Vth, and the compensation value of each sub-pixel unit is calculated by an external calculation circuit in combination with the current-voltage characteristic curve of the OLED, so that each sub-pixel unit can be compensated. Alternatively, a Gamma curve of each sub-pixel can be established by using the obtained threshold voltage of the driving transistor of each sub-pixel unit, and therefore the compensation value of each sub-pixel unit is obtained, and each sub-pixel unit can be compensated.

An embodiment of the present disclosure further provides a display device, and the display device is an OLED display device. The display device comprises a plurality of sub-pixel units disposed in an array; for example, each of the sub-pixel units can be used to emit red light, green light, blue light, or the like. Each of the sub-pixel units comprises a pixel circuit that can drive the OLED to emit light.

Figure 7:
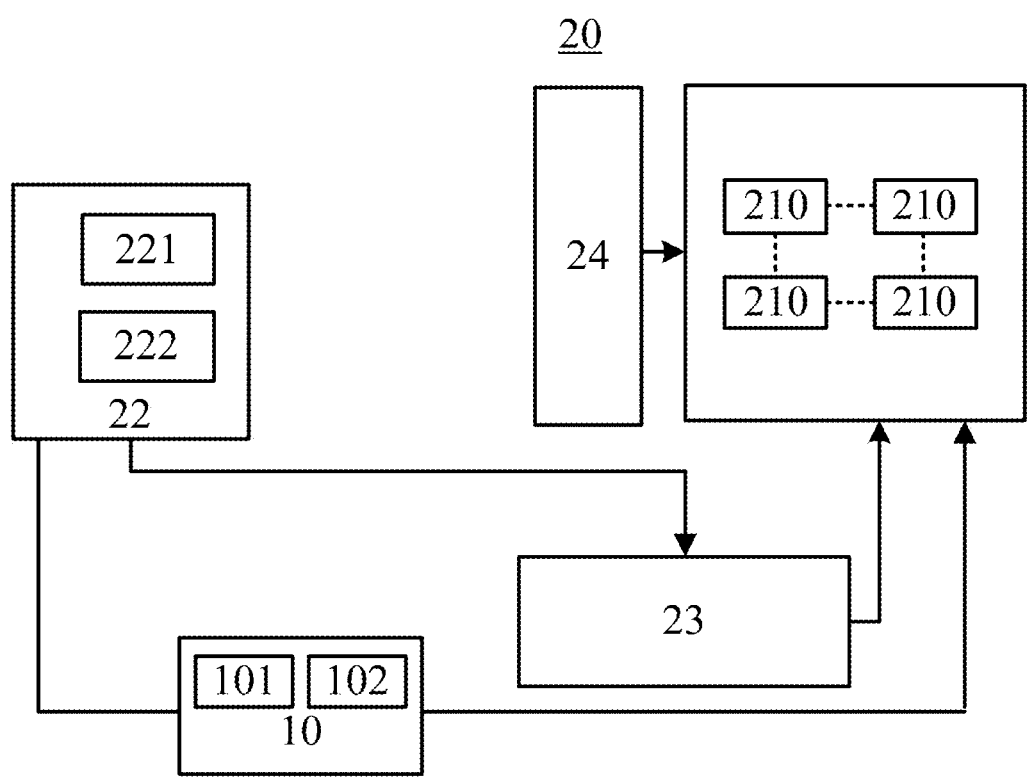
FIG. 7 is a schematic diagram of a display device provided by an embodiment of the present disclosure.

FIG. 7 is a schematic diagram of a display device 20 provided by an embodiment of the present disclosure. The display device 20 comprises a pixel circuit and a control circuit 22. The pixel circuit comprises a plurality of sub-pixel units 210. The pixel circuit is, for example, the pixel circuit illustrated in FIG. 2, FIG. 5 or FIG. 6. The control circuit 22 is configured to perform the detection method of the embodiment of the present disclosure to detect a threshold voltage of a driving transistor of a pixel circuit of each of the sub-pixel units.

For example, the detection method comprises a writing phase and a reading phase, the writing phase comprises: writing a data signal, for example, a reference data voltage Vref, to a gate electrode of the driving transistor and writing a first detection writing voltage V1 to a first electrode of the driving transistor to turn on the driving transistor, and the reference data voltage is less than or equal to the first detection writing voltage; and the reading phase comprises: when the driving transistor is turned off after a first predetermined time after writing the first detection writing voltage, reading a voltage of the first electrode of the driving transistor to obtain a first detection reading voltage Vsig for obtaining a threshold voltage of the driving transistor.

For example, the display device 20 further comprises a data driving circuit 23, a scan driving circuit 24, and a detection circuit 10. The data driving circuit 23 is configured to output the data signal according to requirements (for example, inputting an image signal to the display device), and the pixel circuit of each of the sub-pixel units is further configured to receive the data signal and apply the data signal to the gate electrode of the driving transistor. The scan driving circuit 24 is configured to output various scan signals, comprising the above scan signal Vscan, the scan signal Vscan2, the scan signal Vscan3, and the scan signal Vscan4. For example, the scan driving circuit 24 is an integrated circuit chip or a gate driving circuit directly prepared on the display substrate (GOA).

For example, the detection circuit 10 is configured to apply the first detection writing voltage V1 to the first electrode of the drive transistor and read the first detection reading voltage Vsig from the first electrode of the drive transistor.

For example, the pixel transistor of each of the sub-pixel units comprises a switching transistor T1 and a storage capacitor Cs in addition to the driving transistor. The switching transistor T1 is configured to obtain the data signal from the data driving circuit 23 and write the data signal to the gate electrode of the driving transistor T2, and the storage capacitor Cs stores the data signal.

For example, the control circuit 22 is further configured to control the data driving circuit 23 to apply the data signal, and to control the detection circuit 10 to respectively apply the detection writing voltage and obtain the detection reading voltage. For example, each of the sub-pixel units further comprises a detection switching circuit, and the detection switching circuit comprises a first terminal, a second terminal and a control terminal. The first terminal and the second terminal of the detection switching circuit are respectively connected to the first electrode of the driving transistor and the detection circuit 10, and the control terminal of the detection switching circuit is connected to the detection control line. The control circuit is configured to control the detection control line to turn on the detection switching circuit so as to implement the detection of the driving transistor corresponding to the detection switching circuit.

For example, the detection circuit is further configured to respectively detect the threshold voltages of the driving transistors of at least two sub-pixel units disposed in a same row by a same detection line in a time sharing manner. The second terminals of the detection switching circuits of the at least two sub-pixel units disposed in the same row are connected to a detection circuit via a same detection line and the control terminals of the detection switching circuits of the at least two sub-pixel units disposed in the same row are connected to different detection control lines.

The detection switching circuit can have a variety of configurations. For example, the detection switching circuit comprises a detection switching transistor, and a first electrode and a second electrode of the detection switching transistor are electrically connected to the first electrode of the driving transistor and the detection circuit 10, respectively, and a gate electrode of the detection switching transistor is connected to detection control line. Where the threshold voltages of the driving transistors of the at least two sub-pixel units disposed in the same row are respectively detected by the time sharing method, the gate electrode of the detection switching transistor of each of the sub-pixel units are connected to different detection control lines to receive different scan signals, and the corresponding detection switching transistor is turned on selectively by the scan signal, so that in each detection process, signals are transmitted between the detection circuit and only one sub-pixel unit to perform the above detection process, which is not described again.

For example, the detection switching circuit comprises a first detection switching transistor and a second detection switching transistor in parallel. The gate electrodes of the first switching transistors of the at least two sub-pixel units are connected to a same scan signal, but the gate electrodes of the second detection switching transistors of the at least two sub-pixel units are connected to different detection control lines to receive different scan signals. The corresponding detection switching transistor is turned on selectively by the scan signal, so that in each detection process, signals are transmitted between the detection circuit and only one sub-pixel unit to perform the above detection process, which is not described again. For example, the detection circuit 10 comprises an analog to digital converter 101 and a digital to analog converter 102, and may further comprise an amplifying circuit, a storage circuit (for example, a capacitor), and so on according to requirements. The specific configuration of the detection circuit is not limited to the embodiment of the present disclosure. The detection switching transistor T3 is configured to receive a writing signal, such as the first detection writing voltage V1, from the analog to digital converter 101, and transmit a reading signal, such as the first detection reading voltage Vsig, the second detection reading voltage Vsig and the Nth detection reading voltage Vsign (N is greater than 1) and so on, to the digital to analog converter 102.

For example, the control circuit 22 can be in various forms; for example, the control circuit 22 comprises a processor 221 and a memory 222. The memory 221 comprises executable codes, and the processor 221 can run the executable codes to perform the above detection method.

For example, the processor 221 can be a central processing unit (CPU) or a processing device of other forms with data processing capabilities and/or instruction executing capabilities, such as a microprocessor, a programmable logic controller (PLC), or the like.

For example, the memory 222 can comprise one or more computer program product(s), and the computer program product(s) can comprise computer readable storage media of various forms, such as a volatile memory and/or a nonvolatile memory. The volatile memory can comprise, for example, a random access memory (RAM) and/or a cache and so on. The non-volatile memory can comprise, for example, a read only memory (ROM), a hard disk, a flash memory and so on. One or more computer program instruction(s) can be stored in a computer readable storage medium, and the processor 221 can execute the functions desired by the program instructions. Various applications and various data, such as the detection reading voltages, the compensation value, and the like obtained in the above detection methods can also be stored in the computer readable storage medium.

Embodiments of the present disclosure provide a detection method of a pixel circuit, a driving method of a display panel, and a display device, which are capable of detecting a drift of a threshold voltage of a driving transistor in a pixel circuit, particularly, detecting a negative drift or the like, and therefore a corresponding compensation and improvement can be effectively performed. Therefore, in a situation where the driving transistors of the pixel circuits have non-uniform negative drifts, the display device can be normally used. In addition, a corresponding improvement scheme can be made on the manufacturing processes, so that the manufacture process can be more stable.

In the above description, it is illustrated by taking the driving transistor in the pixel circuit as an N-type transistor for example, but the embodiments of the present disclosure are not limited thereto, and the embodiments can also be used for the P-type driving transistor.

The detection method, the driving method and the display device provided by the embodiments of the present disclosure are also applicable to a positive drift of a threshold voltage of a transistor, for example, by selecting the reference data voltage to be greater than the first writing voltage to perform the above detection method to detect the positive drift of the threshold voltage of the transistor, details are not described again.

What are described above is related to the illustrative embodiments of the disclosure only and not limitative to the scope of the disclosure; the scopes of the disclosure are defined by the accompanying claims.

What is claimed is:

1. A detection method of a pixel circuit, wherein the pixel circuit comprises a driving transistor, and the detection method comprises a writing phase, a reading phase, and a first verifying phase, wherein the writing phase comprises:
   writing a reference data voltage to a gate electrode of the driving transistor, and writing a first detection writing voltage to a first electrode of the driving transistor to turn on the driving transistor, wherein the reference data voltage is less than or equal to the first detection writing voltage, the reading phase comprises:
   upon the driving transistor being turned off after a first predetermined time after writing the first detection writing voltage, reading a voltage of the first electrode of the driving transistor to obtain a first detection reading voltage for obtaining a threshold voltage of the driving transistor, and the first verifying phase comprises:
   writing the reference data voltage to the gate electrode of the driving transistor and applying the first detection reading voltage to the first electrode of the driving transistor for verification, wherein the pixel circuit further comprises an organic light emitting component, the first verifying phase further comprises:
   judging whether the organic light emitting component emits light, and in a case where the organic light emitting component does not emit light, the threshold voltage of the driving transistor is obtained, and a detection process ends.

2. The detection method according to claim 1, further comprising: repeating the writing phase and the reading phase in a case where the organic light emitting component emits light and increasing the first predetermined time in the reading phase to obtain a second detection reading voltage.

3. The detection method according to claim 1, further comprising: selecting a value greater than the first detection reading voltage as a second detection reading voltage in a case where the organic light emitting component emits light.

4. The detection method according to claim 2, further comprising: after obtaining the second detection reading voltage, performing a second verifying phase, wherein the second verifying phase comprises:
   writing the reference data voltage to the gate electrode of the driving transistor and applying the second detection reading voltage to the first electrode of the driving transistor for verification.

5. The detection method according to claim 4, wherein the second verifying phase further comprises:
   judging whether the organic light emitting component emits light,
   wherein in the case where the organic light emitting component does not emit light, the threshold voltage of the driving transistor is obtained, and the detection process ends; otherwise, another second detection reading voltage is obtained, and another second verifying phase is entered until the threshold voltage of the driving transistor is obtained.

6. The detection method according to claim 1, configured for detecting a plurality of pixel circuits in an array, wherein threshold voltages of driving transistors of at least two pixel circuits of the plurality of pixel circuits that are in a same row are respectively detected in a time sharing manner through a same detection line.

7. The detection method according to claim 6, wherein each of the plurality of pixel circuits further comprises a detection switching circuit, and the detection switching circuits of the at least two pixel circuits that are in the same row connect the driving transistors of the at least two pixel circuits to the same detection line, and the detection method further comprises:
   detecting the threshold voltages of the driving transistors of the at least two pixel circuits that are in the same row by turning on the detection switching circuits of the at least two pixel circuits that are in the same row in the time sharing manner.

8. A driving method of a display panel, wherein the display panel comprises a pixel circuit, and the driving method comprises:
   performing the detection method of claim 1 for the pixel circuit to obtain a threshold voltage of a driving transistor of the pixel circuit.

9. The driving method of the display panel according to claim 8, comprising:
   establishing a compensation value of the pixel circuit according to the detected threshold voltage.

10. A display device, comprising a pixel circuit and a control circuit, wherein:
   the pixel circuit comprises a driving transistor;
   the control circuit is configured to perform a detection method, and the detection method comprises a writing phase, a reading phase, and a first verifying phase, wherein the writing phase comprises: writing a reference data voltage to a gate electrode of the driving transistor, and writing a first detection writing voltage to a first electrode of the driving transistor to turn on the driving transistor, and the reference data voltage is less than or equal to the first detection writing voltage;

the reading phase comprises: upon the driving transistor being turned off after a first predetermined time after writing the first detection writing voltage, reading a voltage of the first electrode of the driving transistor to obtain a first detection reading voltage for obtaining a threshold voltage of the driving transistor; and the first verifying phase comprises: writing the reference data voltage to the gate electrode of the driving transistor and applying the first detection reading voltage to the first electrode of the driving transistor for verification, wherein the pixel circuit further comprises an organic light emitting component, the first verifying phase further comprises:

judging whether the organic light emitting component emits light, and in a case where the organic light emitting component does not emit light, the threshold voltage of the driving transistor is obtained, and a detection process ends.

11. The display device according to claim 10, further comprising a detection circuit, wherein the detection circuit is configured to apply the first detection writing voltage to the first electrode of the drive transistor and read the first detection reading voltage from the first electrode of the drive transistor; and the control circuit is configured to control the detection circuit.

12. The display device according to claim 11, comprising a plurality of pixel circuits in an array, wherein the detection circuit is configured to respectively detect threshold voltages of driving transistors of at least two pixel circuits of the plurality of pixel circuits that are in a same row by a same detection line in a time sharing manner.

13. The display device according to claim 12, wherein each of the plurality of pixel circuits further comprises a detection switching circuit, the detection switching circuit connects the driving transistor to the detection circuit, and the control circuit is configured to implement a detection of the driving transistor that corresponds to the detecting circuit by turning on the detection switching circuit.

14. The display device according to claim 13, wherein each of the plurality of pixel circuits further comprises an organic light emitting component, a second electrode and the first electrode of the driving transistor are configured to be respectively connected to a first power supply voltage and a first electrode of the organic light emitting component, and a second electrode of the organic light emitting component is connected to a second power supply voltage, and the detection switching circuit is electrically connected to the first electrode of the driving transistor.

15. The display device according to claim 10, wherein the pixel circuit further comprises a switching transistor and a storage capacitor, the switching transistor is configured to write the reference data voltage to the gate electrode of the driving transistor, and the storage capacitor stores the reference data voltage.

16. The display device according to claim 10, further comprising a data driving circuit, wherein the data driving circuit is configured to output the reference data voltage, and the pixel circuit is further configured to receive the reference data voltage and apply the reference data voltage to the gate electrode of the driving transistor; and the control circuit is configured to control the data driving circuit.

17. The display device according to claim 10, wherein the control circuit comprises a processor and a memory, the memory comprises executable codes, and the processor is configured to run the executable codes to perform the detection method.

* * * * *